(12) United States Patent
Farrar

(10) Patent No.: US 7,064,007 B2
(45) Date of Patent: *Jun. 20, 2006

(54) METHOD OF USING FOAMED INSULATORS IN THREE DIMENSIONAL MULTICHIP STRUCTURES

(75) Inventor: Paul A. Farrar, South Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/006,043

(22) Filed: Dec. 7, 2004

(65) Prior Publication Data

US 2005/0085015 A1 Apr. 21, 2005

Related U.S. Application Data

(62) Division of application No. 09/909,181, filed on Jul. 19, 2001, now Pat. No. 6,831,370.

(51) Int. Cl.
*H01L 21/44* (2006.01)
*H01L 21/48* (2006.01)
*H01L 21/50* (2006.01)

(52) U.S. Cl. .................................................. 438/109
(58) Field of Classification Search ..................... None
See application file for complete search history.

(56) References Cited

U.S. PATENT DOCUMENTS

| | | | |
|---|---|---|---|
| 4,525,921 A | 7/1985 | Carson et al. | |
| 4,617,160 A | 10/1986 | Belanger et al. | |
| 4,706,166 A | 11/1987 | Go | |
| 5,158,986 A | 10/1992 | Cha et al. | |
| 5,202,754 A | 4/1993 | Bertin et al. | |
| 5,270,261 A | 12/1993 | Bertin et al. | |
| 5,334,356 A | 8/1994 | Baldwin et al. | |
| 5,478,781 A | 12/1995 | Bertin et al. | |
| 5,506,753 A | 4/1996 | Bertin et al. | |
| 5,581,498 A | 12/1996 | Ludwig et al. | |
| 5,869,880 A | 2/1999 | Grill et al. | |
| 5,891,797 A | 4/1999 | Farrar | |
| 6,077,792 A * | 6/2000 | Farrar | ........................ 438/780 |
| 6,162,740 A | 12/2000 | Morinaga | |
| 6,239,496 B1 | 5/2001 | Asada | |
| 6,465,742 B1 | 10/2002 | Hiraoka et al. | |
| 2003/0015781 A1 | 1/2003 | Farrar | |

* cited by examiner

*Primary Examiner*—David A. Zarneke
(74) *Attorney, Agent, or Firm*—Knobbe, Martens, Olson & Bear, LLP

(57) ABSTRACT

A multichip cube structure having a foamed insulating material disposed between adjacent integrated circuit chips. The foamed insulating material has lower dielectric constant and therefore reduces the capacitive coupling between electrical interconnects on adjacent chips. The foamed insulating material also has higher ductility and lower thermal coefficient of expansion than conventional oxide insulators so as to reduce the occurrence of stress induced cracking in circuitry.

6 Claims, 4 Drawing Sheets

METHOD OF USING FOAMED INSULATORS IN THREE DIMENSIONAL MULTICHIP STRUCTURES

RELATED APPLICATIONS

This application is a divisional application of U.S. patent application Ser. No. 09/909,181, filed Jul. 19, 2001 now U.S. Pat. No. 6,831,370, which is hereby incorporated by reference in its entirety.

BACKGROUND OF THE INVENTION

1. Field of the Invention

This invention relates to a method of improving performance of a multichip cube structure, and more particularly, to a method of using foamed insulators to reduce the capacitive load of circuitry in the cube structure.

2. Description of the Related Art

To provide improved performance, manufacturers of integrated circuit devices continually strive to increase circuit density. Such devices are typically formed on a semiconductor substrate, such as a silicon wafer, and comprise a large number of miniaturized circuit elements. These elements, which include transistors, diodes, capacitors, and resistors, are usually disposed within or adjacent the substrate and define a plurality of circuit nodes. To combine the circuit elements into a useful electronic circuit, integrated circuit devices require a plurality of conducting paths that link the circuit nodes in a preferred manner. Typically, the conducting paths are provided by electrical interconnects comprising wires of aluminum or aluminum alloy that are embedded in a layer of insulating $SiO_2$.

However, as circuit density is increased, problems associated with conventional electrical interconnects are becoming more apparent. In particular, a higher density device having an increased number of circuit elements will likely require an even greater increase in the number of electrical interconnects. Consequently, the electrical interconnects will need to have a reduced thickness and adjacent interconnects will need to be spaced more closely together. Unfortunately, such dimensional reductions tend to increase the resistance of individual interconnects and increase the capacitance between adjacent interconnects, thereby possibly increasing signal propagation delays and signal crosstalk.

This problem is particularly apparent in high density electronic packaging modules such as multichip cube structures or three-dimensional multi-chip structures. A multichip cube structure typically comprises a plurality of semiconductor chips that are adhered together in a stack. It is generally understood that each chip in the stack has conductive leads that extend to one edge of the chip so as to provide electrical contact with external circuitry. In most multichip cube structures, the conductive leads on the chips are closely spaced where adjacent leads are sometimes separated by less than 1 micron. Shrinking the distance between adjacent leads can adversely increase the capacitive load. Furthermore, stacking the chips in close proximity to one another as required in multichip cube structures can also increase the capacitive coupling between electrical interconnects on adjacent chips.

To address the problem of increased capacitive coupling between adjacent interconnects, designers have tried substituting materials having lower dielectric constants for the more commonly used oxide insulators such as $SiO_2$. In some cases, polymers such as polyimides have been used in place of $SiO_2$, however polyimides provide only limited improvement as the dielectric constant of polyimide (2.8–3.5) is only slightly lower than that of conventional oxide insulators. Furthermore, interconnects comprising an air bridge have also been developed as described in U.S. Pat. No. 5,891,797. The air bridge is a length of conducting material that extends from a first supported end to a second supported end through an air space such that the bridge is substantially surrounded by air. Consequently, because air has a dielectric constant that is substantially less than that of $SiO_2$, the capacitance between adjacent interconnects is reduced. However, the use of air-bridged structures will pose some additional problems in packaging as it does not protect the metal interconnect structure from environmental attacks. They will also prove difficult to assemble in very dense packaging schemes such as multichip cube structures.

Hence from the foregoing, it will be appreciated that there is a need for a method to reduce the capacitive load of electrical interconnects in multichip cube structures. To this end, there is a particular need for a low dielectric insulating material that can isolate adjacent chips in a multichip cube structure and decrease the capacitive load of the interconnects in adjacent chips. Furthermore, there is also a need for the insulating material to retain the desirable physical and mechanical properties afforded by the conventional insulating materials used in multichip cube structure.

SUMMARY OF THE INVENTION

The aforementioned needs are satisfied by the device and process of the present invention which is directed to the manufacture of a high density semiconductor structure having reduced capacitive coupling between electrical interconnects. In one aspect, the high density semiconductor structure comprises a first integrated circuit chip having an upper bonding surface and a second integrated circuit chip secured to the first chip in a manner such that a lower bonding surface of the second chip is positioned adjacent to the upper bonding surface of the first chip. The semiconductor structure also includes a chip insulating layer that is interposed between the first and second chips so as to provide electrical isolation between the chips. Furthermore, the insulating layer comprises an insulating material and a plurality of enclosed regions of air dispersed throughout the insulating material. Preferably, the enclosed regions of air cause the dielectric constant of the insulating layer to be less than the dielectric constant of the insulating material.

In another embodiment, the semiconductor structure further comprises a conductor insulating layer formed on the upper bonding surface of the first chip so as to provide electrical isolation between adjacent conductive leads disposed on the upper surface thereof. Furthermore, the conductor insulating layer comprises an insulating material and a plurality of enclosed regions of air dispersed throughout the insulating material. Preferably, the enclosed regions of air cause the dielectric constant of the insulating layer to be lower than the dielectric constant of the insulating material.

In yet another embodiment, the semiconductor structure further comprises a third integrated circuit chip that is secured to the second chip in a manner such that a lower bonding surface of the third chip is positioned adjacent to an upper bonding surface of the second chip. Preferably, an insulating layer is also disposed between the second and third chips. The insulating layer may comprises a foamed polyimide material. In one embodiment, an additional insulating layer may also be formed on a lower surface of the first chip so as to insulate the exposed back surface of the chip. Preferably, the insulating layer also comprises a foamed polymeric material.

In another aspect, the present invention provides a multichip cube structure comprising a first integrated circuit chip having a first insulating layer disposed on an upper surface of the chip so as to electrically isolate a plurality of electrical interconnects disposed on the upper surface thereof. Furthermore, the first insulating layer is comprised of an insulating material having a first dielectric constant. Preferably, at least a portion of the first insulating layer contains enclosed regions of air that reduce the dielectric constant of the first insulating layer to a value lower than the first dielectric constant.

The multichip cube structure also includes a second integrated circuit chip secured to the first chip in a manner such that a lower surface of the second chip is positioned adjacent the upper surface of the first chip. Furthermore, a second insulating layer is interposed between the first and second chips. Preferably, the second insulating layer is comprised of a second insulating material having a second dielectric constant and at least a portion of the second insulating layer contains a plurality of enclosed regions of air that reduce the dielectric constant of the second insulating layer to a value lower than the second dielectric constant.

In yet another aspect, the present invention provides a method of manufacturing a multichip cube structure having reduced capacitive loading in the electrical interconnects. The method comprises forming an insulating layer on an upper bonding surface of a first chip; reducing the dielectric constant of the insulating layer by creating a plurality of voids in the insulating layer; and securing a second chip to the upper bonding surface of the first chip wherein a lower bonding surface of the second chip is positioned adjacent the upper surface of the insulating layer on the first chip. The voids in the insulating layer reduce the dielectric constant of the insulating layer, thereby permitting the chips to be stacked closer together without significantly increasing the capacitive load of the interconnects.

Advantageously, the present invention provides a high density semiconductor device having an insulating material with a dielectric constant that is lower than that of most known insulating materials. It is generally understood that the dielectric constant of the insulating material directly affects the capacitive load of the circuits and that a lower dielectric constant will decrease the capacitive coupling of electrical interconnects between adjacent chips in the device. Furthermore, the insulating material of the present invention not only provides a lower dielectric constant but also retains the favorable physical and mechanical properties of most conventional polymeric materials. As such, the present invention provides densely packaged multichip cube structures with a novel insulating material that provides effective electrical isolation between closely spaced adjacent chips and does not reduce the speed of signal propagation through the electrical interconnections. These and other advantages of the present invention will become more fully apparent from the following description taken in conjunction with the accompanying drawings.

DETAILED DESCRIPTION OF THE PREFERRED EMBODIMENT

Figure 1:
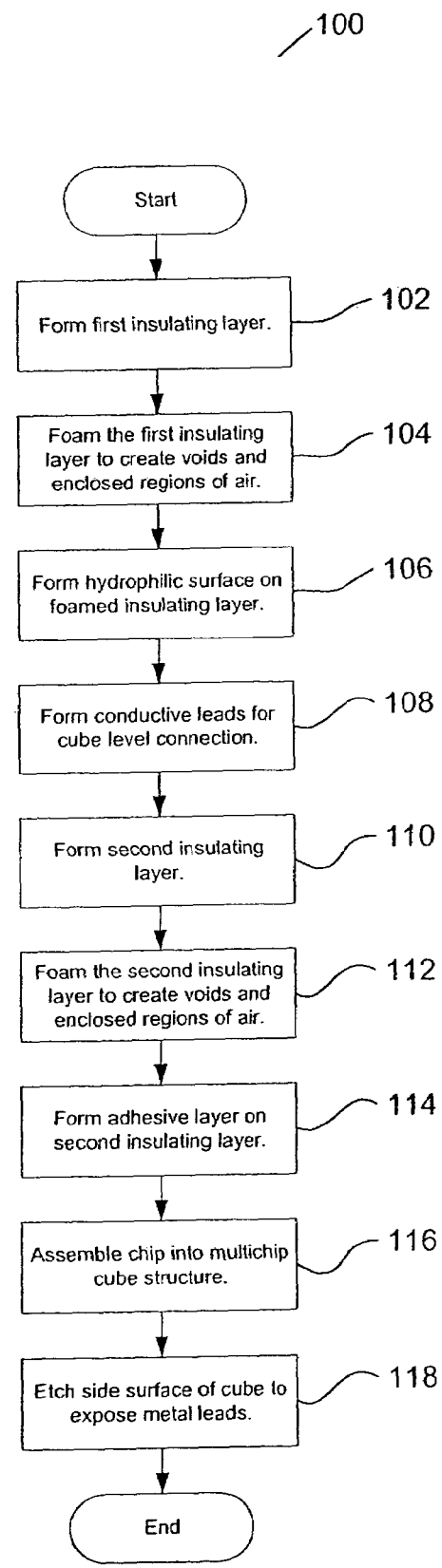
FIG. 1 illustrates a process flow of manufacturing a multichip cube structure of the preferred embodiment.

References will now be made to the drawings wherein like numerals refer to like parts throughout. FIG. 1 illustrates a preferred process 100 of using foamed insulators to reduce the capacitive load of electrical interconnects in a multichip cube structure. The process 100 of the preferred embodiment begins with a semiconductor wafer that is ready for cube level interconnection. In particular, the wafer has already been processed through the standard manufacturing processes in which various integrated devices and circuitry are formed on the wafer.

As shown in FIG. 1, the process 100 begins with step 102 in which a first insulating layer is formed on an upper surface of the wafer. Preferably, the first insulating layer comprises a polymeric material that contains silane additives and has a low dielectric constant between about 2.8–3.5. In one embodiment, a layer of polyimide approximately 0.7 micron thick is applied to the upper surface of the wafer using conventional photo-spinning processes and subsequently cured using a standard multi-step curing process. However, other suitable polymeric materials such as polynorbornene can also be selected for use as the first insulating layer. The first insulating layer provides electrical insulation between a multiplicity of conductive leads that will be formed on the upper surface of the wafer for cube level connection. However, it should be understood that the first insulation layer is not necessary for some embodiments of the present invention and that the entire sequence of steps related to the formation of the first insulation layer may be skipped.

As FIG. 1 shows, subsequent to forming the first insulating layer, the process 100 continues with step 104 in which at least a portion of the first insulating layer is converted to a foamed state in a manner described in U.S. Pat. No. 6,077,792 to Farrar, entitled "METHOD OF FORMING FOAMED POLYMERIC MATERIAL FOR AN INTEGRATED CIRCUIT" which is assigned to Micron Technologies, Inc. and hereby incorporated by reference in its entirety. In one embodiment, the foaming process includes exposing the first insulating layer to a supercritical fluid such as carbon dioxide so as to form a plurality of voids and enclosed regions of air in the polymeric material. These voids or enclosed regions of air cause the first insulating layer to increase in thickness and decrease in dielectric constant. In one embodiment, the thickness of the first insulating layer is increased by a factor of three to about 2.1 microns while the dielectric constant is decreased to about less than 1.5.

Furthermore, the diameter of the voids or enclosed regions of air created in the insulating material is preferably less than the width of the space between adjacent leads that will be formed adjacent the first insulating layer. Voids having diameters that are greater than the width between adjacent leads may cause electrical shorting between the lines because there would not be any insulating material separating the lines at where the voids are located. In one embodiment, the average diameter of the voids is preferably less than 3 microns, more preferably less than 1 micron, more preferably approximately 0.1 micron.

Advantageously, the foamed insulating material has a lower dielectric constant than most known insulating materials and yet still retains most of the advantages afforded by conventional polymeric insulating materials. For instance, polymeric materials such as polyimides generally have thermal coefficients of expansion that are similar to that of metal conductors, which will likely reduce stress induced cracking of the metal conductors during thermal cycling. Furthermore, polymers tend to have a lower elastic modulus and yield strength when compared with conventional oxide insulators and thus will absorb a portion of the potential strain during various thermal processing of the semiconductor chip. The foamed insulating material has substantially the same coefficient of thermal expansion, elastic modulus, and other physical and mechanical properties, except yield strength, as that of the base polymer.

As FIG. 1 further illustrates, the process 100 also includes an optional step 106 in which a hydrophilic surface is formed on the foamed first insulating layer. Step 106 is generally applicable if the first insulating layer comprises a hydrophobic material such as polynorbornene. In one embodiment, an upper surface of the foamed insulating layer is exposed to $CH_3$ and H. In particular, the $CH_3$ radicals react with the polymeric material to form a hydrophilic surface in a manner described in Applicant's co-pending application, entitled "INSULATORS FOR HIGH DENSITY CIRCUITS", U.S. patent application Ser. No. 09/382,524. Preferably, methane gas is used as a source for the $CH_3$ and H radicals because of its relative stability.

Furthermore, after foaming the first insulating layer, the process 100 continues with a metallization step 108 in which conductive leads for cube connection are formed on the upper surface of the wafer. As it is generally understood in the art, these conductive leads extend from the upper surface of each chip to an edge of the chip to provide electrical contact to external circuitry when the chip is assembled as part of a multichip cube structure. Preferably, the conductive leads are made of metal such as copper, aluminum, or alloys thereof. In one embodiment, the metal leads are formed on the upper surface of the chip using conventional photo processing and deposition techniques, in which sections of the foamed first insulating layer are removed and replaced with the metal leads. Preferably, these conductive leads are approximately 1 to 3 microns thick and spaced about 1 micron or less apart. As described above, the conductive leads are electrically isolated from each other by the foamed first insulating layer formed in the previous steps. The low dielectric constant of the foamed insulating material also helps to minimize the capacitive load of the conductive leads as it is generally understood that the resistance capacitive loading (RC) of a line is directly proportional to the dielectric constant of the insulator. ($RC=2pEe(4\{L/P\}+\{L/T\}$ where p=specific resistance of the line, E=the dielectric constant of the insulator, e=the dielectric constant of the space between the lines, L=the line length, P=the pitch of the lines, and T=the line thickness.) The reduction in capacitive loading is particularly helpful in cases where the capacitive load is relatively high due to the tight spacing between adjacent leads.

As it is further illustrated in FIG. 1, subsequent to the metallization step 108, the process 100 continues with step 110 in which a second layer of insulating material is formed on an upper surface of the first insulating layer and the conductive leads. The second insulating layer provides electrical isolation between adjacent chips when the chip is assembled into a multichip cube structure in a manner to be described in greater detail below. Preferably, the second insulating layer comprises generally the same polymeric material as that used for the first insulating layer. The thickness of the second insulating layer may vary depending on the extent of insulation required between adjacent chips. In one embodiment, a layer of polyimide that is approximately 0.7 micron is applied to the upper surface of the wafer using a conventional photoresist spinning process and subsequently cured using a standard multi-step curing process. In an alternate embodiment, after the polyimide is cured, an additional insulating layer (not shown) is applied to a lower surface of the wafer and then cured. Preferably, this additional layer of insulating material is applied to the back surface of chips that will later be positioned either on the lower end of the chip stack so that the exposed back surface of the chip at the lower end of the stack is also protected by a polymer layer or above a chip on which the top surface wiring has not been protected by an insulating layer. In addition to polyimides, other suitable polymers and their associated primers can also be used without departing from the scope of the present invention.

Following formation of the second insulating layer in step 110, the process 100 continues with step 112 in which at least a portion of the second insulating layer is converted to a foamed state using methods described in U.S. Pat. No. 6,077,792. Similar to step 104, the foaming process involves exposing the second insulating layer to a supercritical fluid such as carbon dioxide so as to form a plurality of voids and enclosed regions of air in the polymeric material. These voids or enclosed regions of air cause the second insulating layer to increase in thickness and decrease in dielectric constant. In one embodiment, the thickness of the second insulating layer is increased by a factor of three to about 2.1 microns while the dielectric constant is decreased to about less than 1.5. The second insulating layer provides electrical insulation between adjacent chips in a multichip cube structure. Advantageously, the foamed second insulating layer has a lower dielectric constant than most conventional insulating materials, which permits designers to reduce the thickness of the insulating layer between adjacent chips without significantly increasing the capacitive load of the circuits.

Furthermore, the process 100 comprises an optional step 114 in which an adhesive layer is applied to an upper surface of the second insulating layer. The adhesive layer may comprise of epoxy or other adhesives generally known in the art. The adhesive layer is formulated to bond the chip to adjacent chips in a multichip cube structure. However, the adhesive may also be incorporated into the second insulating layer so that the second insulating layer will directly bond to adjacent chips.

Subsequent to application of the adhesive in step 114, the process 100 includes a step 116 in which the wafer is diced into individual chips and the chip is stacked together with other similarly prepared chips to form a three dimensional multichip structure such as a cube structure that is generally known in the art. In one embodiment, the chip is laminated to two other chips in which the upper surface of the chip is bonded to an upper chip while the lower surface of the chip is bonded to lower chip so that the chip is sandwiched between the upper and lower chips. Preferably, the second insulating layer electrically isolates the chip from the upper adjacent chip. Likewise, a similar foamed insulating layer can also be used to isolate the chip from the lower adjacent chip. Furthermore, the foamed second insulating layer has a reduced dielectric constant and therefore reduces the capacitive coupling between electrical interconnects in adjacent chips.

Subsequent to assembling the chips into a multichip cube structure, the assembly is subject to an etching step 118 in which a side surface of the assembly is etched back so as to expose the conductive leads on each chip. The cube structure is then subject to additional conventional manufacturing processes including mounting the cube structure onto a base substrate. Advantageously, the foamed insulating layers interposed between the chips provide an insulating material with a lower dielectric constant than most conventional insulation materials. The decrease in dielectric constant will reduce capacitive load of the interconnects in the chips, which will in turn improve the speed and performance of the device.

As described above, the use of porous polymeric insulators also have other potential advantages as the minimum feature size and metal line size decrease to well below one micron. When traditional oxide insulators are used, the metal stripes are subject to significant stress during thermal excursions in manufacturing or use. This is caused by the mismatch in the thermal coefficient of expansion of the metal and the oxide. At elevated temperatures either during deposition or subsequent annealing operations, the metal can plastically deform and relieve any stress imposed by the difference in thermal expansion coefficients. However, upon cooling the relatively high coefficient of thermal expansion of the metal compared to the oxide places the metal line in tension and the $SiO_2$ in compression. The level of tension can be high enough to cause rupture in the line. Porous polymeric foams, on the other hand, have coefficients of thermal expansion that are relatively close to that of the metal so that the metal will be subject to significantly less stress during thermal cycles. Furthermore, insulating materials such foamed polyimide will absorb a portion of the potential strain during various thermal processing of the semiconductor chip as it has lower elastic modulus and yield strength when compared with conventional oxide insulators.

Figure 2:
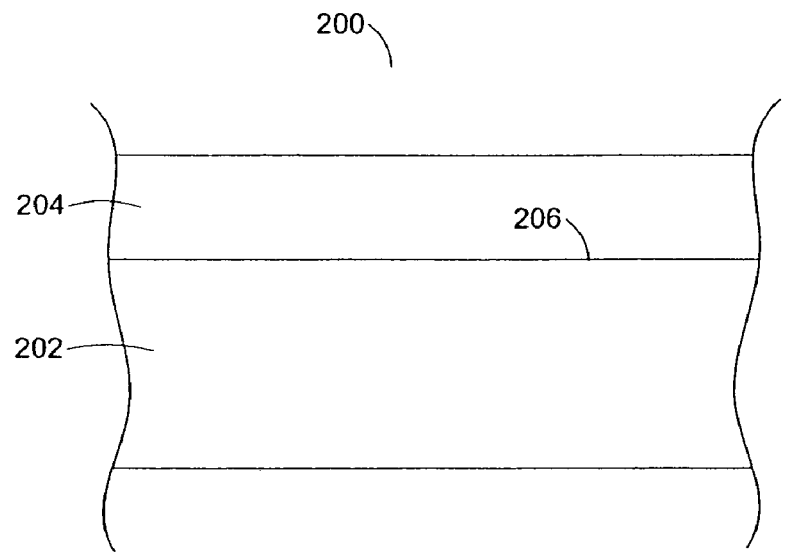
FIG. 2 is a schematic cross-sectional view of a chip that will be assembly into a multichip cube structure of the preferred embodiment, showing a conductor insulating layer applied to an upper bonding surface of the chip.

FIG. 2 provides a schematic cross-sectional view of an integrated circuit chip 200 that will be assembled into a multichip cube module of the preferred embodiment. As shown in FIG. 2, the chip 200 comprises a silicon substrate 202 carrying a variety of integrated devices and circuitry formed using conventional semiconductor manufacturing processes. The chip 200 also has a conductor insulating layer 204 formed on an upper surface 206 of the substrate 202. Preferably, the conductor insulating layer 204 comprises a polyimide material and is approximately 0.7 micron thick. The conductor insulating layer 204 provides insulation between adjacent metal traces that will be formed on the upper surface 206 of the substrate 202 for cube connection.

Figure 3:
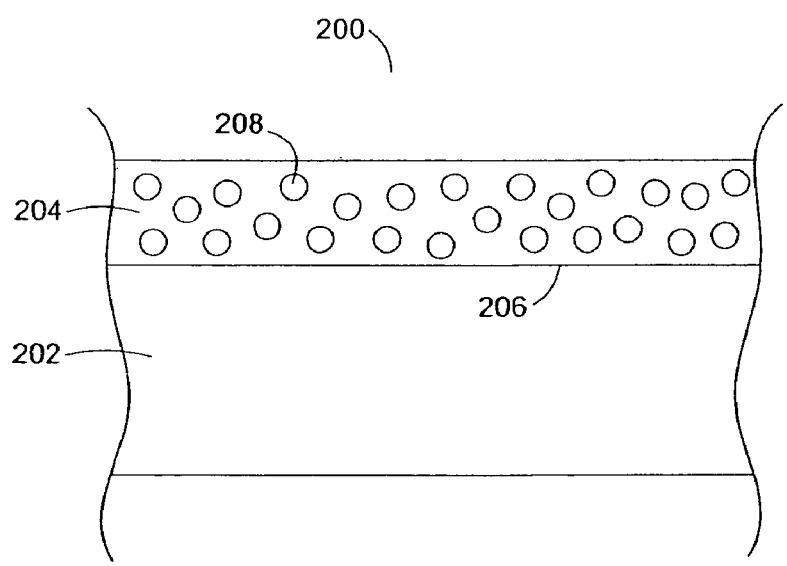
FIG. 3 is a schematic cross-sectional view of the chip of FIG. 2 showing a plurality of metal leads formed on the upper bonding surface of the chip.

FIG. 3 shows the conductor insulating layer 204 after undergoing a foaming process in which voids are introduced into the insulating material. As shown in FIG. 3, a plurality of voids or enclosed regions of air 208 are dispersed throughout the conductor insulating layer 204. Preferably, each void is less than 0.1 micron and is formed using a foaming process described in U.S. Pat. No. 6,077,792 issued to Farrar. The voids or enclosed regions of air 204 lowers the dielectric constant of the conductor insulating layer 204 without adversely affecting the physical or mechanical properties of the insulating layer. As such, the conductor insulating layer 204 containing the voids will lower the capacitive loading of circuitry that it insulates. In one embodiment, the voids 204 lower the dielectric constant of the conductor insulating layer by about 50% from 2.7 to less than 1.5 and increases the thickness of the layer by about 300% from 0.7 to 2.1 microns.

Figure 4:
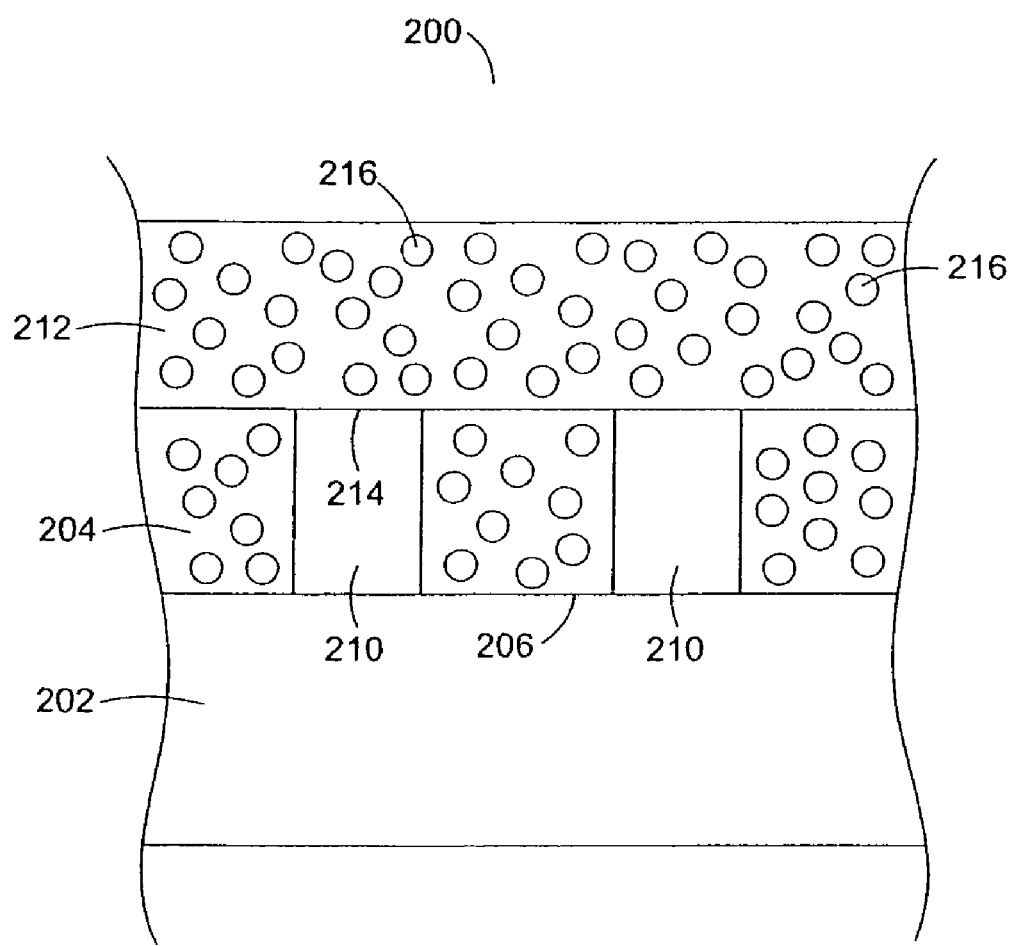
FIG. 4 is a schematic cross-sectional view of the chip of FIG. 3, showing a chip insulating layer applied to an upper surface of the conductor insulating layer.

As FIG. 4 shows, a plurality of metal traces 210 are formed on the upper surface 206 of the substrate 202 using conventional photo and deposition processes. In particular, the metal traces 210 extend from the upper surface 206 of the substrate 202 to a first edge of the substrate 202 so as to provide electrical leads to external circuitry when the chip 200 is assembled as part of a multichip cube structure in a manner to be described in greater detail below. Preferably, the metal traces 210 are approximately 1–3 microns thick so as to minimize the effect of the difference of coefficient of expansion between the metal leads and the silicon substrate 202.

Furthermore, as shown in FIG. 4, a foamed chip insulating layer 212 is formed on an upper surface 214 of the conductor insulating layer 204 so as to protect the metal traces 210 and provide insulation from adjacent chips that will later be assembled. The chip insulation material can be deposited on the upper surface 214 of the conductor insulating layer 204 using conventional photo-spinning techniques and then subject to the foaming process described above so as to form a plurality of voids 216 in the insulating material. Preferably, the voids 216 are smaller than the minimum distance between adjacent leads 210 so as to reduce the occurrence of electrical shorting between the leads. Furthermore, the thickness of the chip insulating layer 212 may vary, depending on the extent of the electrical insulation required. In one embodiment, the conductor insulating layer is approximately 0.7 microns thick in an unfoamed state so as to achieve a 2.1 micron thick foamed insulating layer. The chip insulating layer 212 may comprise a foamed polyimide material, a foamed polynorbornenes material, or any other suitable foamed polymers.

Figure 5:
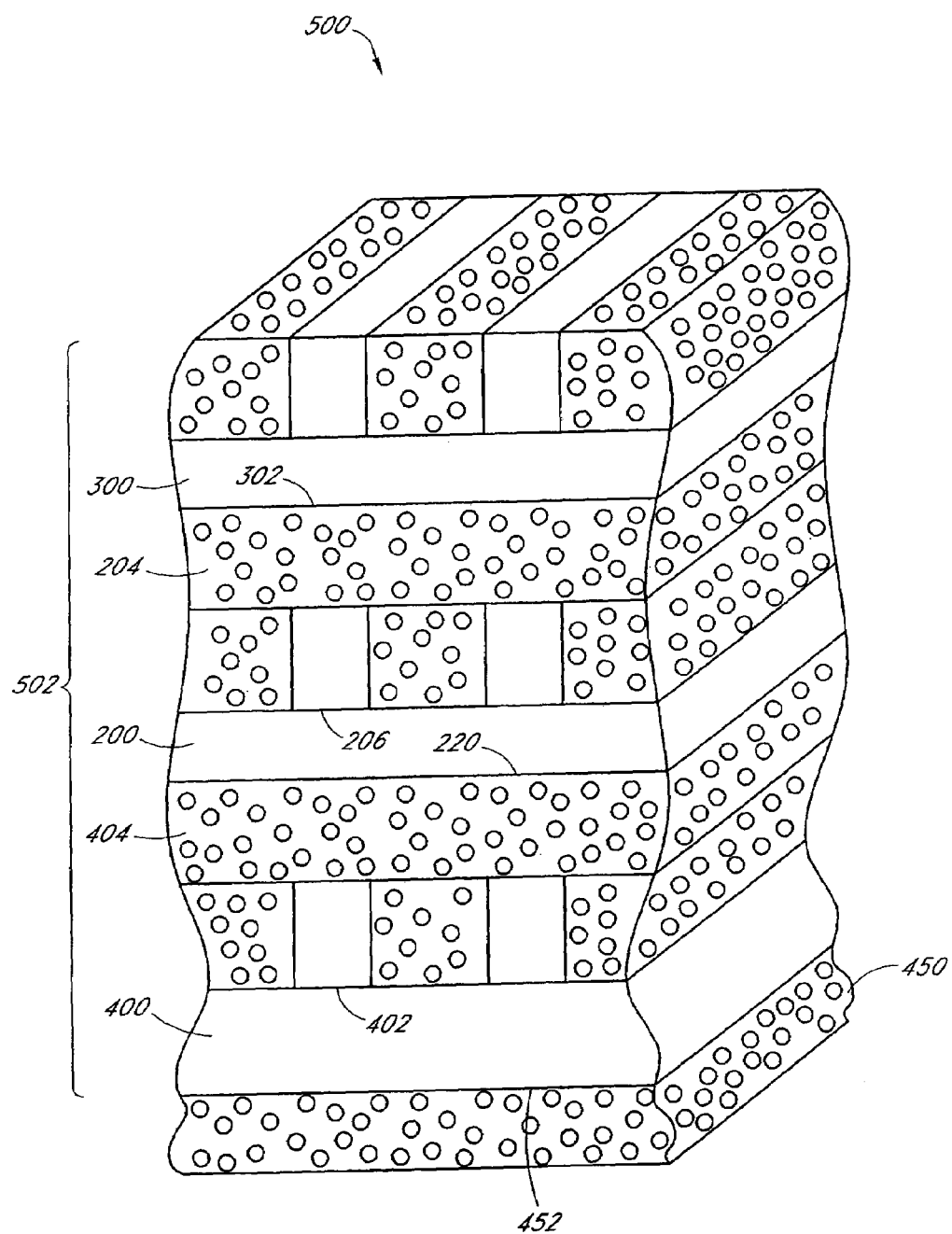
FIG. 5 is a schematic cross-sectional view of the chip of FIG. 4 assembled into a multichip cube structure.

FIG. 5 shows a schematic cross-sectional view of a multichip cube structure 500 that incorporates the integrated circuit chip 200 into a stack 502 with other similarly prepared chips 300, 400. As shown in FIG. 5, the chips 200, 300, 400 are bonded together in a manner such that the upper surface 206 of the chip 200 is positioned adjacent a lower planar surface 302 of a second chip 300 while a lower surface 220 of the chip 200 is placed adjacent an upper planar surface 402 of a third chip 400. It can be appreciated that the number of chips assembled in such a stack can vary depending on the particular application.

Furthermore, as FIG. 5 illustrates, the chips 200, 300, 400 are isolated from each other by foamed chip insulating layers 204, 404 that are interposed between adjacent chips. As described above, these foamed chip insulating layers 204, 404 provide an effective low dielectric constant insulating material that will in turn reduce the capacitive load of electrical interconnects adjacent the insulating layers. It is generally understood that a high capacitive load is undesirable in certain applications, particularly in densely packaged circuits where it would lead to greater signal delay. Advantageously, the present invention provides a way to decrease the capacitive coupling between adjacent integrated circuit chips in densely packed multichip modules without causing potentially detrimental reduction in mechanical integrity of the structure.

Although the foregoing description of the preferred embodiment of the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the invention. Consequently, the scope of the invention should not be limited to the foregoing discussions, but should be defined by the appended claims.

What is claimed is:

1. A method of manufacturing a multichip cube structure having reduced capacitive loading, comprising:
    forming an insulating layer on an upper bonding surface of a first chip;
    reducing the dielectric constant of the insulating layer by creating a plurality of voids in the insulating layer; and
    securing a second chip to the upper bonding surface of the first chip wherein a lower bonding surface of the second chip is positioned adjacent the upper bonding surface of the first chip.

2. The method of claim 1 wherein creating a plurality of voids in the insulating layer comprises exposing the insulating layer to a supercritical fluid.

3. The method of claim 2 wherein exposing the insulating layer to the supercritical fluid comprises exposing the insulating layer to carbon dioxide.

4. The method of claim 1 wherein securing the second chip to the upper bonding surface of the first chip comprises using an adhesive.

5. The method of claim 1 wherein forming the insulating layer on the upper bonding surface of the first chip comprises forming an insulating layer having embedded adhesives.

6. The method of claim 1 wherein forming the insulating layer comprises forming a polyimide layer.

* * * * *